(12) United States Patent
Matsuura et al.

(10) Patent No.: US 7,365,487 B2
(45) Date of Patent: Apr. 29, 2008

(54) ORGANIC ELECTROLUMINESCENCE DISPLAY APPARATUS

(75) Inventors: Hiroyasu Matsuura, Yokohama (JP); Shingo Ishihara, Yonezawa (JP); Keiji Takanosu, Yokohama (JP); Eiji Matsuzaki, Yokohama (JP)

(73) Assignee: Hitachi Displays, Ltd., Mobara-Shi (JP)

( * ) Notice: Subject to any disclaimer, the term of this patent is extended or adjusted under 35 U.S.C. 154(b) by 332 days.

(21) Appl. No.: 10/992,851

(22) Filed: Nov. 22, 2004

(65) Prior Publication Data

US 2005/0212413 A1    Sep. 29, 2005

(30) Foreign Application Priority Data

Mar. 19, 2004    (JP)    ............................. 2004-079450

(51) Int. Cl.
H05B 33/00    (2006.01)

(52) U.S. Cl. ...................... 313/506; 313/509; 313/512

(58) Field of Classification Search ......... 313/498–512
See application file for complete search history.

(56) References Cited

U.S. PATENT DOCUMENTS 5,703,436 A    12/1997    Forrest et al.
7,026,658 B2 *    4/2006    Park et al. ..................... 257/98

FOREIGN PATENT DOCUMENTS

JP    2001-148291    5/2001
JP    2001-217072    8/2001
JP    2001-230086    8/2001

\* cited by examiner

Primary Examiner—Nimeshkumar D. Patel
Assistant Examiner—Anthony Perry
(74) Attorney, Agent, or Firm—Antonelli, Terry, Stout & Kraus, LLP.

(57) ABSTRACT

The organic electroluminescence display apparatus of the present invention comprises a first and second substrates, the former being coated with banks for separating pixels, a lower electrode, organic light-emitting layer and upper electrode of a transparent material in this order, and the latter being coated with a color filter and electroconductive shadow pattern, wherein the organic light-emitting layer surrounded by the banks for separating pixels faces the color filter, and the first and second substrates face each other in such a way that the upper electrode over the banks for separating pixels is electrically connected to the electroconductive shadow pattern.

This structure connects at least one of the upper electrode and electroconductive shadow pattern to a power supply point, to control ununiform emitted light brightness which may result from voltage drop at the upper transparent electrode.

Moreover, the organic light-emitting layer can be formed without a vapor deposition mask having a precise aperture pattern, to efficiently produce the organic EL display apparatus.

6 Claims, 13 Drawing Sheets

ORGANIC ELECTROLUMINESCENCE DISPLAY APPARATUS

BACKGROUND OF THE INVENTION

The present invention relates to an organic electroluminescence display apparatus.

An organic electroluminescence (hereinafter referred to as "organic EL") display apparatus is formed by arranging a plurality of elements, each being essentially of 3-layer structure with an organic light-emitting layer placed between an anode and cathode electrodes, the former for injecting holes and the latter for injecting electrons into the intermediate layer.

The organic light-emitting layer is of (1) 2-layer structure with an emitting layer and hole transport layer in this order from the cathode electrode side, (2) 2-layer structure with an electron transport layer and emitting layer in this order from the cathode electrode side, or (3) 3-layer structure with an electron transport layer, emitting layer and hole transport layer in this order from the cathode electrode side. When a voltage of several volts is applied to the element between the electrodes, holes are injected from the anode electrode and electrons from the cathode electrode, and they are combined with each other in the emitting layer to emit light.

Display apparatuses with an organic EL element fall into two types, one is driven by a simple matrix and the other by an active matrix. An organic EL display apparatus driven by a simple matrix has organic light-emitting layers positioned at the intersections of anode lines with cathode lines, and each pixel is on only for a selected time in one frame period. Selected time is a time span of one frame period divided by number of the anode lines. An apparatus of this type has an advantage of simple structure.

However, selected time decreases as number of pixels increases. In order to secure a given average brightness in one frame period, therefore, it is necessary to increase instantaneous brightness in a selected time span by increasing driving voltage. This causes problems resulting from shortened service life. An organic light-emitting element, which is driven by current, suffers voltage drop caused by wiring resistance, in particular in the case of large screen. As a result, voltage cannot be applied uniformly to pixels, deteriorating brightness uniformity in the apparatus. Therefore, there are limitations of precision and screen size for an organic light-emitting display apparatus.

In an organic light-emitting display apparatus driven by an active matrix, on the other hand, 2 to 4 driving elements, each composed of a switching element of thin-film transistor and capacitor, are connected to an organic light-emitting element which constitutes a sub-pixel. As a result, all pixels can be on in a frame period to extend service life of the organic light-emitting element, because necessity for increasing brightness is removed. Therefore, an active matrix type organic light-emitting display apparatus is more advantageous over a simple matrix type, when high precision and large screen are required.

A conventional organic light-emitting display apparatus has a bottom emission structure with light emitted from the back side of the substrate. This structure limits aperture ratio of an active matrix type organic light-emitting display apparatus with a driving section between the substrate and organic light-emitting element.

One attempt to solve these problems is adoption of a top emission structure, in which the upper electrode is made transparent and light is emitted from the upper electrode. For example, Patent Document 1 discloses an organic EL element of top emission structure having an upper electrode of 2-layer structure, with the first layer of Mg, Ag or the like working as an injection layer and second layer of ITO (indium tin oxide) or the like working as a transparent electrode.

Patent Document 2 discloses an active matrix type organic light-emitting display apparatus characterized by its pixel structure with a partition provided on the position at which a driving element electrode is connected to a lower electrode for an organic light-emitting element working as a pixel. The document also discloses that the above structure is applicable to a display apparatus which emits light from the upper electrode side.

As an attempt to prevent lowered brightness of emitted light resulting from distance from the point at which power is supplied to the electrode, Patent Document 3 discloses a structure with an auxiliary power source line of low resistance material, provided beside the pixel and connected to the upper transparent electrode.

Patent Document 4 discloses a structure which realizes full-color display using a color filter or color conversion filter, where all of the pixels of top emission structure are devised to emit white or blue color.

Patent Document 1: U.S. Pat. No. 5,703,436
Patent Document 2: JP-A-2001-148291
Patent Document 3: JP-A-2001-230086
Patent Document 4: JP-A-2001-217072

SUMMARY OF THE INVENTION

A top emission structure involves problems, when it is applied to large-size, organic EL display apparatuses. A transparent, electroconductive film as an upper electrode for a top emission structure must be formed at low temperature, to prevent damages on an organic layer working as a base layer. As a result, it has a high resistance, or at least 300 times higher resistivity than a metallic film of Al or the like. Even when a metallic film is used as an upper electrode, its thickness is limited to reduce damages on an organic layer working as a base layer while keeping required transparency. Thus, the problems result from high upper electrode resistance.

An organic light-emitting element for each pixel is supplied with electrons or holes from an upper electrode. The electrode is supplied with power normally at a substrate edge. When a transparent, electroconductive material having a higher resistance than a current supply line for a lower electrode is used as an upper electrode, wiring resistance, which increases with distance between the power supply point and pixel, is no longer negligible. Therefore, drop of effective voltage to be applied to an organic light-emitting element constituting a pixel is no longer negligible as distance between the power supply point and pixel increases, to notably fluctuate brightness. The structure disclosed by Patent Document 3 tries to prevent effective voltage drop by connecting an auxiliary power source line of low resistance material, provided beside the pixel, to the upper transparent electrode.

However, this structure needs a means for preventing deposition of an organic matter on the area in which the auxiliary power source line is connected to the transparent, upper electrode. When the organic light-emitting layer of a low-molecular-weight material is to be formed by vapor deposition, the connecting area on the auxiliary electrode must be covered with a precisely fabricated vapor deposition mask. This mask is normally of a 10 to 100 μm thick metal sheet, perforated by etching or electroforming.

The mask sheet is difficult to fabricate for large-size products, irrespective of fabrication method, although not difficult for products of small size, low resolution and low aperture ratio. The difficulty increases as required resolution or aperture ratio increases.

The mask with a precisely fabricated pattern must be precisely aligned with a substrate. The vapor deposition mask and substrate increase in temperature during the vapor deposition process by heat radiated from the evaporation source, which is heated to evaporate the material to be deposited. Misalignment between the mask and substrate may occur during the vapor deposition process, when there is a difference in thermal expansion coefficient between them. It is therefore difficult to cover the connecting area on the auxiliary electrode without deteriorating aperture ratio.

Moreover, when an organic light-emitting layer is formed by vapor deposition with a vapor deposition mask having precisely patterned apertures, the organic material will deposit on the mask back side. Therefore, the mask must be periodically cleaned, because deposition of the organic material on the precisely fabricated apertures decreases deposition width. It is difficult to clean the mask without damaging the metal sheet, which is low in strength. Cleaning of the mask greatly increases the cost. Use of a disposable mask also greatly increases the cost.

As discussed above, productivity of a display apparatus of large size, high resolution and high aperture ratio is determined by a vapor deposition mask provided with precisely fabricated apertures, because it increases production difficulty and cost.

A structure with pixels emitting only white or blue color, e.g., that disclosed by Patent Document 4, can have a sufficient aperture width, because masking is required only for those areas other than pixel area. A vapor deposition mask can be easily produced for such a structure, because precisely fabricated apertures are no longer required. Moreover, alignment between the mask and substrate may be relaxed to 100 to 500 μm or so from several to around 50 μm required for a mask of precisely fabricated apertures.

The mask can have a longer service life for vapor deposition than the one with precisely fabricated apertures, because its precision is less sensitive to deposition of the organic material to be evaporated. Therefore, the mask allows an organic light-emitting layer to be formed by vapor deposition at a lower cost, because the layer productivity is not determined by the mask by itself. However, the transparent, upper electrode can be supplied with power only at the substrate edge, which invariably deteriorates brightness uniformity of emitted light on a display area in a large-size display apparatus.

As discussed above, conventional techniques cannot increase size of an organic EL display apparatus while reducing the vapor deposition cost. It is an object of the present invention to provide a display apparatus of organic EL device structure which causes no deterioration of brightness uniformity even when apparatus size is increased, and easily achieves reduced production cost in vapor deposition for forming the organic light-emitting layer while securing device service life.

Means for Solving the Problems

The organic electronic display apparatus of the present invention comprises a first and second substrates, the former being coated with banks for separating pixels, a lower electrode, organic light-emitting layer and upper electrode of a transparent material in this order, and the latter with a color filter and electroconductive shadow pattern, wherein the organic light-emitting layer surrounded by the banks for separating pixels faces the color filter, the first and second substrates face each other in such a way that the upper electrode over the banks for separating pixels is electrically connected to the electroconductive shadow pattern, and at least one of the upper electrode and electroconductive shadow pattern is connected to a power supply point, in order to solve the above problems.

The electroconductive shadow pattern is composed of a shadow layer and electroconductive layer, wherein the electroconductive layer may be electrically connected to the upper electrode. The electroconductive shadow pattern is made of a material having a lower resistivity than the upper electrode. Specifically, the electroconductive shadow pattern material preferably has a resistivity of $1/100$ or less of that of the upper electrode.

The first substrate is coated with a transistor driving layer provided with a transistor element having a gate, source and drain interconnections, banks for separating pixels, lower electrode, organic light-emitting layer and upper electrode of a transparent material in this order, and the second substrate is coated with a color filter and electroconductive shadow pattern, wherein the organic light-emitting layer surrounded by the banks for separating pixels faces the color filter, the first and second substrates face each other in such a way that the upper electrode over the banks for separating pixels is electrically connected to the electroconductive shadow pattern via an electroconductive member, and at least one of the upper electrode and electroconductive shadow pattern is provided with a power supply point electrically connected to an outside DC power source.

The electroconductive member may be a spherical or columnar spacer positioned on the electroconductive shadow pattern. The electroconductive shadow pattern may be electrically connected to the upper electrode via a transparent, electroconductive film provided on the columnar spacer. The upper electrode may be covered with a protective film. A similar effect can be produced by electrically connecting the upper electrode to the electroconductive shadow pattern via the electroconductive member provided in such a way to pass through the protective film.

The second substrate may be further coated with a transparent, overcoat layer, after the color filter and electroconductive shadow pattern are formed, to electrically connect the upper electrode to the electroconductive shadow pattern via the electroconductive member provided in such a way to pass through the overcoat layer.

An organic light-emitting layer which is devised to emit a single color can constitute a display apparatus. It can constitute a display apparatus, when it works to emit white color as a single color.

Moreover, the first and second substrates are sealed by an adhesive layer provided around at least one of the first and second substrates, with the sealed space filled with an inert gas.

As discussed above, the present invention can reduce voltage drop at a pixel far removed from a power supply point and prevent ununiform distribution of emitted light brightness in the display region even in a large-size, organic EL display apparatus of top emission structure. At the same time, it is free of a problem of reduced aperture ratio, because a member functioning as an auxiliary electrode is an electroconductive shadow pattern, which is connected to an upper electrode at a point immediately below the pattern. Adoption of a top emission structure extends element service life, because it works at a lower light intensity per unit area than a bottom emission structure for securing the same brightness.

Moreover, the organic light-emitting layer producing the above effects can be formed by vapor deposition with a mask having apertures provided over the entire display region instead of a mask having precisely fabricated apertures for each pixel. This reduces production cost and lead time from those required by vapor deposition with a mask having precisely fabricated apertures for each pixel.

Still more, it is on a level with an LCD in resolution, which determines productivity of vapor deposition carried out for each pixel.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF PREFERRED EMBODIMENTS

Example 1

Figure 1:
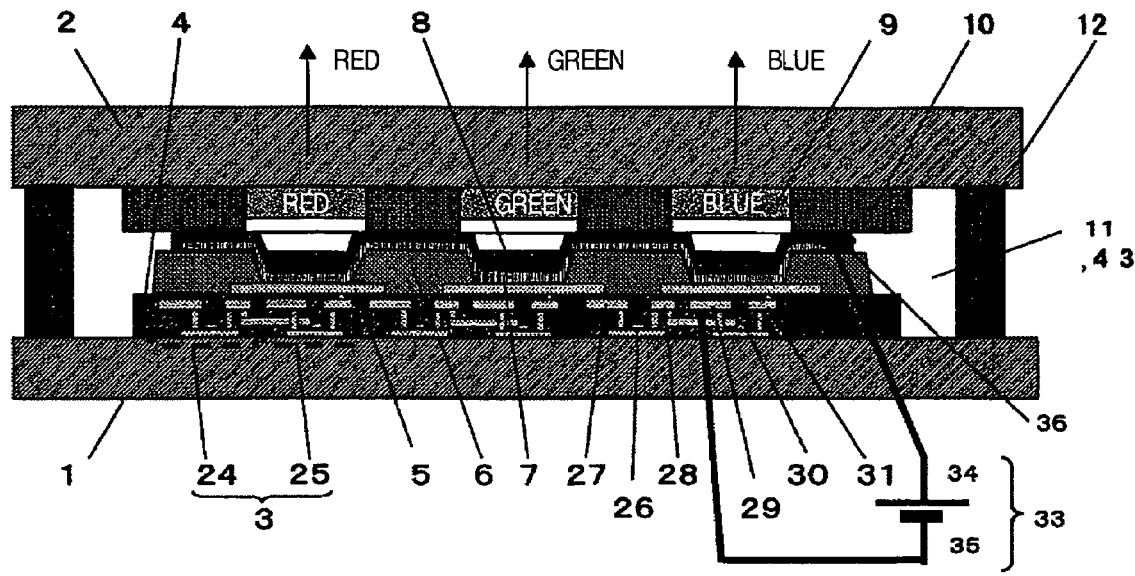
FIG. 1 is a cross-sectional view illustrating the organic EL display apparatus of the embodiment 1 of the present invention.

The embodiment 1 of the organic EL display apparatus of the present invention is described by referring to the drawings. FIG. 1 is a cross-sectional view illustrating the organic EL display apparatus of the embodiment 1 of the present invention.

The organic light-emitting element formed on the first substrate 1 is composed of the organic light-emitting layer 7 and upper electrode (transparent electrode) 8 on the substrate 1, the layer 7 being composed of the lower electrode 5, first injection layer, first transport layer, light-emitting layer, second transport layer and second injection layer.

Broadly speaking, the organic light-emitting element structurally falls into one of the following types.

The first type uses the lower electrode 5 as the anode and upper transparent electrode 8 as the cathode. In this case, the first injection layer and first transport layer in the organic light-emitting element 7 work as the hole injection layer and hole transport layer, respectively, and the second transport layer and second injection layer work as the electron transport layer and electron injection layer, respectively.

The second type uses the lower electrode as the cathode and upper transparent electrode as the anode. In this case, the first injection layer and first transport layer work as the electron injection layer and electron transport layer, respectively, and the second transport layer and second injection layer work as the hole transport layer and hole injection layer, respectively.

In the above structure, the first or second injection layer may be removed, and the first or second transport layer may work also as the light-emitting layer.

The anode in the above structure is preferably in the form of electroconductive film of high work function, which enhances hole injection efficiency. Specifically, the materials for the anode include, but not limited to, gold and platinum.

Moreover, the anode may be of a two-element system including indium tin oxide (ITO), indium zinc oxide (IZO) or indium germanium oxide, or three-element system including indium zinc oxide. The composition may be composed of tin oxide or zinc oxide as the major component, instead of indium oxide. When ITO is used, the composition normally includes tin oxide at 5 to 10% by weight on indium oxide. The oxide semiconductor may be produced by sputtering, EB vapor deposition, ion plating or the like.

The anode may be of a common electroconductive film, which is not required to have a high work function, because the hole injection layer is provided. Specifically, the preferable materials for the anode include metals, e.g., aluminum, indium, molybdenum, nickel and an alloy of one of these metals; and inorganic materials, e.g., polysilicon, amorphous silicon, tin oxide, indium oxide and indium tin oxide (ITO). The other preferable materials include organic materials, e.g., polyaniline and polythiophene; and electroconductive ink, which can be formed by a simple process of spreading. The preferable materials are not limited to the above, needless to say. They may be used either individually or in combination.

The hole injection layer is preferably made of a material having an adequate ionization potential to reduce an injection barrier at the anode and hole transport layer. Moreover, it preferably works to smooth rough base layer surfaces. Specifically, the preferable materials for the hole injection layer include, but not limited to, copper phthalocyanine, starburst amine compound, polyaniline, polythiophene, vanadium oxide, molybdenum oxide, ruthenium oxide and aluminum oxide.

The hole transport layer works to transport holes and inject them into the light-emitting layer. Therefore, it preferably has a high hole mobility. Moreover, it is preferably chemically stable and low in ionization potential. The other characteristics it preferably has include low electron affinity and high glass transition temperature. Specifically, the preferable materials include N,N'-bis(3-methylphenyl)-N,N'-diphenyl-[1,1'-biphenyl]-4,4'-diamine(TPD), 4,4'-bis[N-(1-naphthyl)-N-phenylamino]biphenyl($\alpha$-NPD), 4,4',4"-tri(N-carbazolyl)triphenylamine(TCTA) and 1,3,5-tris[N-(4-diphenylaminophenyl)phenylamino]benzene(p-DPA-TDAB) The preferable materials are not limited to the above, needless to say. They may be used either individually or in combination.

The light-emitting layer is the layer in which the injected holes and electrons are recombined each other to emit light of a wavelength specific to a material. Light may be emitted by a host material for the light-emitting layer, or by a trace quantity of dopant incorporated in a host material. Specifically, the preferable materials for the layer include a distyrylarylene derivative (DPVBi), silole derivative with one or more benzene rings in the skeleton (2PSP), oxodiazole derivative with triphenylamine structures at both terminals (EM2), perinone derivative with phenanthlene group (P1), oligothiophene derivative with triphenylamine structures at both terminals (BMA-3T), perylene derivative (tBu-PTC), tris(8-quinolinol)aluminum, polyparaphenylene-vinylene derivative, polythiophene derivative, polyparaphenylene derivative, polysilane derivative and polyacetylene derivative. The preferable materials are not limited to the above, needless to say. They may be used either individually or in combination.

Specifically, the preferable dopant materials include quinacridone, coumarin 6, Nile Red, rubrene, 4-(dicyanomethylene)-2-methyl-6-(para-dimethylaminostyryl)-4H-pyran(DCM) and a dicarbazole derivative. The preferable materials are not limited to the above, needless to say. They may be used either individually or in combination.

The electron transport layer works to transport electrons and inject them into the light-emitting layer. Therefore, it preferably has a high electron mobility. Moreover, it is preferably chemically stable and low in ionization potential. The other characteristics it preferably has include low electron affinity and high glass transition temperature. Specifically, the preferable materials for the layer include tris(8-quinolinol)aluminum, a oxadiazole derivative, silole derivative and zinc benzothiazole complex. The preferable materials are not limited to the above, needless to say. They may be used either individually or in combination.

The electron injection layer is used to enhance efficiency of injecting electrons from the cathode into the electron transport layer. Specifically, the preferable materials for the layer include lithium fluoride, magnesium fluoride, calcium fluoride, strontium fluoride, barium fluoride, magnesium oxide and aluminum oxide. The preferable materials are not limited to the above, needless to say. They may be used either individually or in combination.

The cathode is preferably in the form of electroconductive film of low work function, which enhances electron injection efficiency. Specifically, the materials for the anode include, but not limited to, a magnesium/silver alloy, aluminum/lithium alloy, aluminum/calcium alloy, aluminum/magnesium alloy and metallic calcium.

The cathode may be of a common metallic material, which is not required to have a low work function, because the electron injection layer is provided. Specifically, the preferable materials for the cathode include metals, e.g., aluminum, indium, molybdenum, nickel and an alloy of one of these metals; and polysilicon and amorphous silicon.

FIG. 1 illustrates one embodiment of the present invention with the lower and upper electrodes working as the anode and cathode, respectively. In this embodiment, a plurality of the TFTs 3 are arranged at constant intervals in a grid-like pattern on the glass substrate 1. Scanning lines (not shown) for driving the TFTs 3 are arranged at constant intervals, and signal lines (not shown) for transmitting image information are arranged at constant intervals to intersect with the scanning lines at right angles. The scanning lines and signal lines form a grid-like pattern, and a region formed by these lines corresponds to one pixel. At the same time, a plurality of current supply lines (not shown), connected to the minus terminal 35 for the DC power source 33, run on the glass substrate 1 in parallel to the signal lines.

The scanning, signal lines and power supply lines are formed within the transistor driving layer 4. Film thickness of the transistor driving layer 4 above the transistor 3 is set at around 500 nm in this embodiment to secure film surface flatness and its insulation capacity. However, the thickness is not limited to the above, so long as the layer 4 performs the above functions.

Figure 14:
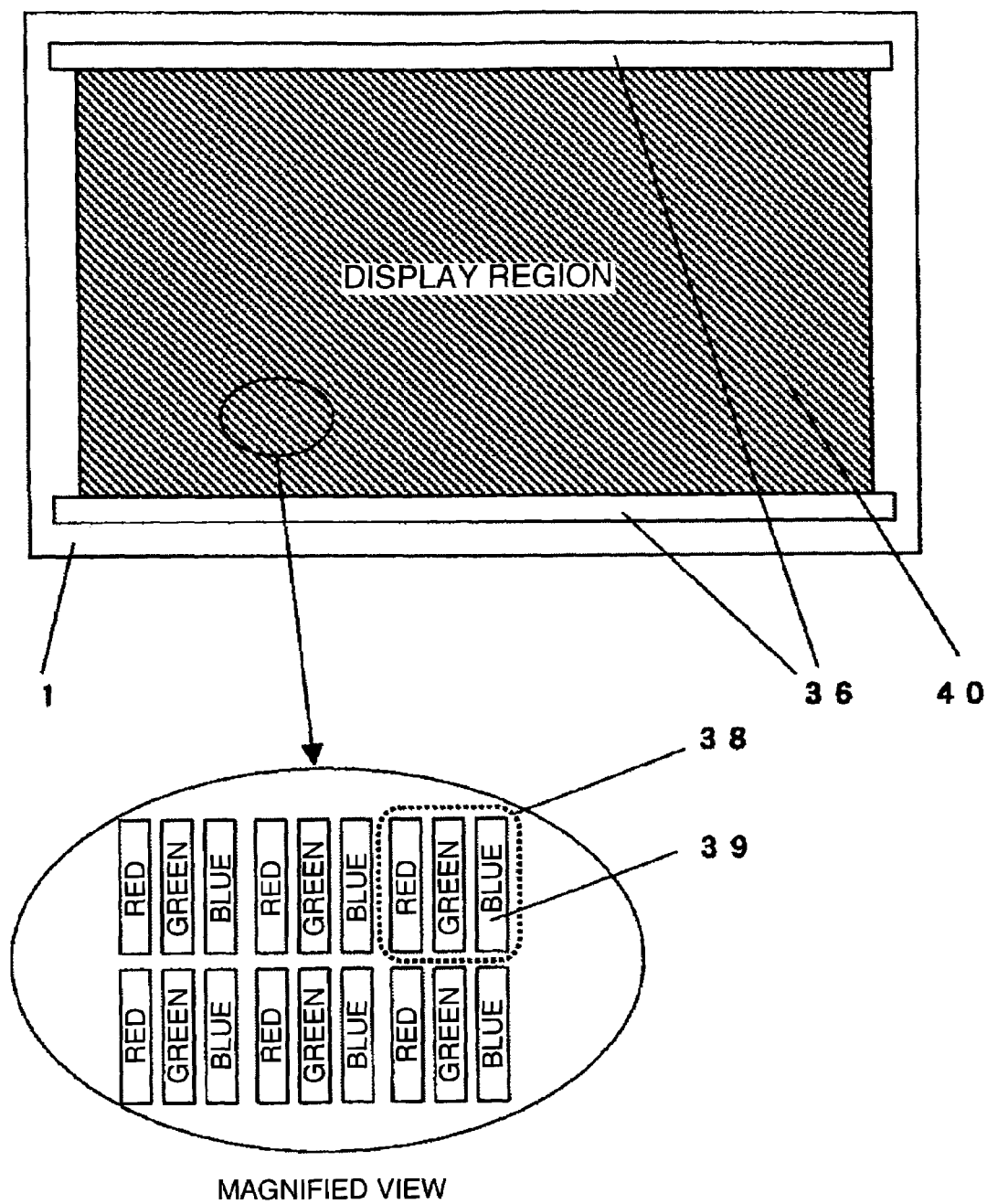
FIG. 14 is a cross-sectional view illustrating the positional relationship between the display region and power supply point on the first substrate of the embodiment 1 of the present invention.

In a monochromic display apparatus, one display region corresponds to one display element working as one pixel. In a full-color display apparatus, on the other hand, the regions from which red, green or blue color are emitted are generally allocated to the display regions 40 for the display elements, as shown in FIG. 14. In this case, each display element is defined as a sub-pixel 39, and 3 adjacent sub-pixels for red, green or blue color work as one pixel 38 to control image display. In a full-color display apparatus, an image may be controlled with four-color pixels for white color in addition to the above 3 colors. The transistor 3 controls light-emitting elements each working as a pixel in the case of monochromic apparatus, or light-emitting elements each working as a sub-pixel in the case of full-color apparatus.

The lower electrode (cathode) 5 corresponding to each transistor 3 is provided on the transistor driving layer 4. The preferable cathode materials include metals, e.g., aluminum, indium, molybdenum, nickel and an alloy of one of these metals; and inorganic materials, e.g., polysilicon, amorphous silicon, tin oxide, indium oxide and indium tin oxide (ITO). In this example, an Mg—Ag alloy is used to form the 100 to 200 nm thick lower electrode 5. Thickness of the electrode is not limited to the above, so long as it can sufficiently supply electrons. The transistor 3 and lower electrode 5 are connected to each other via a through hole provided in the transistor driving layer 4.

The banks 6 for separating pixels of an insulating material are provided around the lower electrode 5 and on the transistor 3, to prevent edge growth resulting from steps around the lower electrode 5. Therefore, each bank is preferably at least as thick as the lower electrode 5. In this example, a thickness of each bank 6 is set at 150 to 250 nm. However, the thickness is not limited to the above. Each bank 6 preferably has the lower edge wider than the upper edge to increase coverage of the film provided thereon.

The organic light-emitting layer 7 is formed, after the lower electrode 5 and banks 6 are formed. For each organic light-emitting element, the electron injection layer, electron transport layer, light-emitting layer, hole transport layer and hole injection layer are formed in this order. These layers are formed by vapor deposition, when they are made of a low-molecular-weight material. These layers for the organic light-emitting layer 7 can be formed for the present invention while covering each of them, except the display region, with mask having apertures provided over the entire display region.

Therefore, vapor deposition cost can be greatly reduced from that incurred when a mask having precisely fabricated apertures for each pixel is used. However, a mask having precisely fabricated apertures could be used to change a material to be spread for each pixel. The organic light-emitting layer 7 is preferably designed to emit white or blue color, when formed in the former method.

In the first substrate 1, the upper transparent electrode 8 provided on the power supply point 36 works as an electrode, when the plus electrode 34 for the DC power source 33 outside of the display apparatus is connected to the point 36 by an interconnection. In this example, therefore, the organic light-emitting layer 7 formed by vapor deposition while covering the power supply point 36 with a vapor deposition mask to ensure that the upper transparent electrode 8 is electrically connected to the power supply point 36 provided at the substrate edge.

Moreover, the organic light-emitting layer 7 is formed to emit white color in this example. It comprised a 30 nm thick electron transport layer of blue metallic complex (Znbox2), 30 nm thick light-emitting layer of yellow metallic complex (ZnSq2) and 40 nm thick hole transmit layer of aromatic diamine (TPD). The present invention, however, is not limited to the above combination.

The upper transparent electrode 8 is formed on the organic light-emitting layer 7 by sputtering while the whole display region and power supply point 36 at the substrate 1 edge are covered with a mask having apertures. Specifically, the materials for the upper transparent electrode 8 include $In_2O_3$—$SnO_2$-based and $In_2)_3$—Zn-based ones formed into a transparent electroconductive film. In particular, an $In_2O_3$—$SnO_2$-based transparent electroconductive film is used as a pixel electrode for liquid-crystal display apparatuses. In this example, a 100 to 300 nm thick $In_2O_3$—$SnO_2$-based film (ITO film) is formed as the upper transparent electrode 8. However, the present invention is not limited to the above thickness and material.

The organic light-emitting layer 7 can be supplied with holes from the upper transparent electrode 8, when the power supply point 36 is connected to the plus electrode 34 for the power source 33 outside of the display apparatus by an interconnection. In this example, the power supply point 36 is provided on the first substrate side. However, it may be provided on the electroconductive shadow pattern 10 on the second substrate 2.

The second glass substrate 2 is coated with the electroconductive shadow pattern 10 open to each pixel on the first substrate 1. The electroconductive shadow pattern 10 is made of a metal, e.g., Al, Cr, Ag, Cu, Mo, Ni or an alloy of one of these metals, which has a resistivity of 1/100 or less of that of a transparent electrode material, e.g., ITO or IZO. The metallic shadow layer is normally 100 to 150 nm thick. The electroconductive shadow pattern 10 works also as a power interconnection in addition to light shadowing, and preferably has a thickness equivalent to that of the upper transparent electrode 8 or current-supply line 30, i.e., 100 to 300 nm. Moreover, the electroconductive shadow pattern 10 is preferably at least as thick as the color filter layer 9, because the electroconductive shadow pattern 10 must be brought into contact with the upper transparent electrode 8 on the first substrate 1.

In this example, Mo is used for the electroconductive shadow pattern 10. Mo has a resistivity of $5.6 \times 10^{-6} \Omega \cdot cm$, comparing with 600 to $800 \times 10^{-6} \Omega \cdot cm$ as resistivity of ITO used for the upper transparent electrode 8. Thus, the electroconductive shadow pattern 10 has a resistivity less than 1/100 of that of the upper transparent electrode 8. The electroconductive shadow pattern 10 and color filter layer 9 are designed to have the same thickness of 300 nm.

The apparatus can have a reduced resistance by bringing the upper transparent electrode 8 on the first substrate 1 into contact with the electroconductive shadow pattern 10 on the second substrate 2, after they are assembled.

One example of calculated voltage drop at the upper transparent electrode 8 is described with an emitted light brightness set at 300 $cd/m^2$ assuming that it is made of an organic light-emitting material of high light-emitting efficiency having a light intensity of 10 cd/A per unit current. The other assumptions are allowable voltage for constant-current driving: 10V, aspect ratio of apparatus screen: 9/16, and pixel numbers: 1200 dots in the longitudinal direction and 2000 dots in the lateral direction. Moreover, two terminals on the major sides of the display region work as the power supply points 36 (FIG. 14).

First, voltage drop in the absence of electroconductive shadow pattern is calculated. Voltage drop ΔV at the center of the display region is given by Formula (1):

$$\Delta V = \Sigma(N \times i \times r) = \frac{1}{2} \times N(N+1) \times i \times r \quad (1)$$

wherein,

N: half of total pixel number in the longitudinal direction (=600 dots)

i: constant current passing through one pixel r: resistance of the upper transparent electrode per pixel Current i and resistance r per pixel are given by Formula (2) and Formula (3):

$$i = 300 \ [cd/m^2]/10 \ [cd/A] \times w \times L = 30 \ wL \ [A] \quad (2)$$

$$r = \rho 1 \times L/(w \times t) \ [\Omega] \quad (3)$$

wherein,

ρ1: resistivity of the upper transparent electrode t: film thickness w: pixel width L: pixel length Pixel width w and length L are given by formula (4) and Formula (5):

$$w = W0/2000 \ [m/dot] \quad (4)$$

$$L = L0/1200 \ [m/dot] \quad (5)$$

wherein,

W0: width of the display region in the longitudinal direction

L0: width of the display region in the lateral direction

Voltage drop ΔV [V] is calculated on the assumptions of upper transparent electrode thickness: 300 nm and resistivity of ITO as a material for the upper transparent electrode: 600Ω·cm. The results are given in FIG. 15, which plots the calculated ΔV against diagonal length of the display region. As shown, a voltage drop of 15V or more can occur even at a diagonal length of 20 inches, by which is meant that voltage drop exceeds the allowable voltage of 10V for securing constant-current driving in this case. Therefore, uniformity of emitted light brightness in the display region should deteriorate, because of reduced current passing through the element.

Voltage drop can be controlled within an initially set allowable voltage range by increasing thickness of the upper transparent electrode 8. Increasing the thickness, however, is impractical, because of the accompanied optical losses resulting from decreased transmittance and increased lateral propagation of light to decrease light availability.

Figure 15:
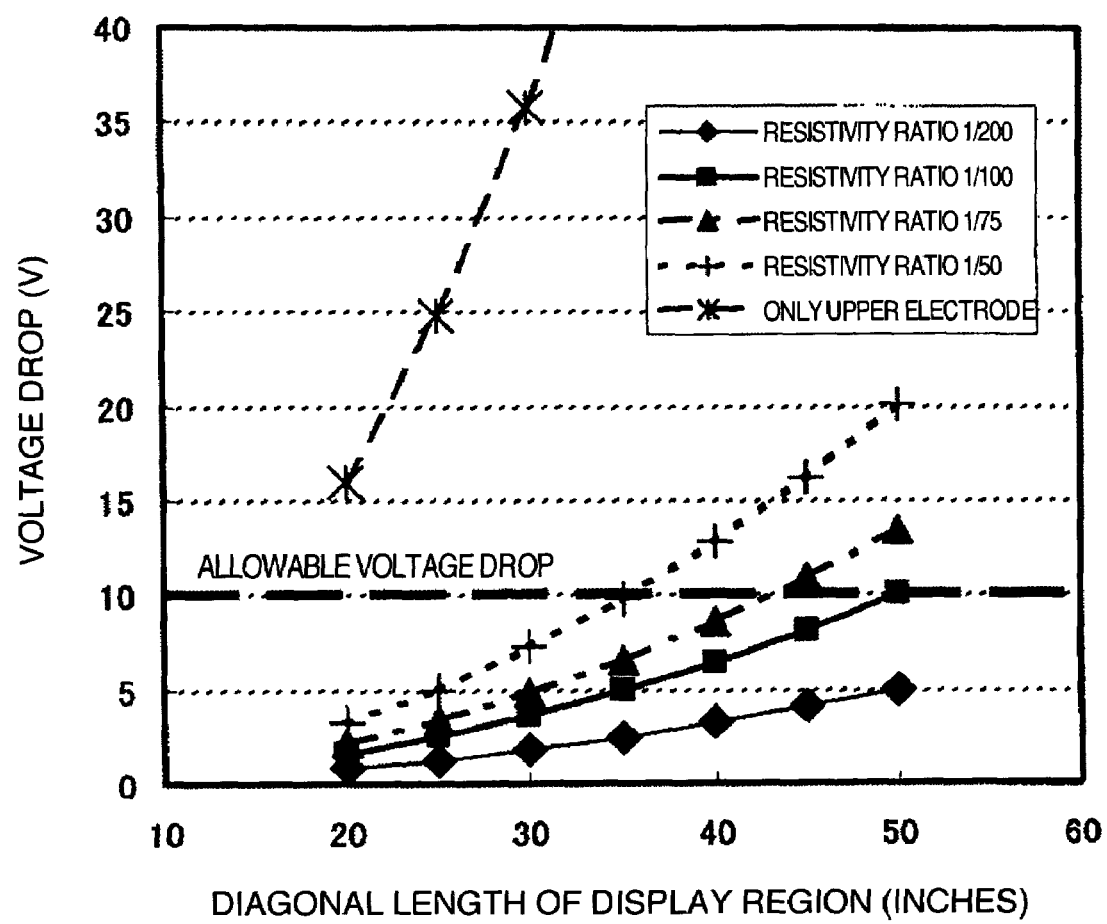
FIG. 15 presents examples of calculated voltage drops at the center of the display region of the present invention.

Voltage drop will be halved when ITO is replaced by IZO, whose resistivity (300 to 400) is lower than ITO, because voltage drop is in proportion to resistivity. However, display apparatus size will be still limited to a diagonal length of 25 inches or so. An organic EL light-emitting element is driven normally at around 10V. Increasing driving voltage increases voltage drop, as shown in FIG. 15, and cannot increase size of a display apparatus driven by a constant current.

Next, voltage drop in the presence of the electroconductive shadow layer for the present invention is discussed on the assumption that a film thickness t of the electroconductive shadow layer is the same as that of the upper transparent electrode (300 nm).

A liquid crystal has an aperture ratio of around 75% at present, which is expected to increase to around 80% in the future. In this calculation, an aperture ratio of 80% is adopted. The ratio of width in the longitudinal direction to width in the lateral direction of the electroconductive shadow pattern is set at the same ratio of the pixel size (10.56%).

Current passing through one pixel is also given by formula (2), described earlier. Resistance r is a synthesized level of the upper transparent electrode side resistance r1 and electroconductive shadow pattern 10 side resistance r2.

The width in the lateral direction of the electroconductive shadow pattern can be represented by 0.1056w. Resistance r2 of the electroconductive shadow pattern in the longitudinal direction is given by Formula (6):

$$r2=\rho2\times L/(0.1056\ w\times t)\ [\Omega] \quad (6)$$

wherein, $\rho2$: resistivity of the electroconductive shadow pattern 10.

Resistance of one pixel on the upper transparent electrode side r1 is given by Formula (7):

$$r1=\rho1\times L/(w\times t)\ [\Omega] \quad (7)$$

Therefore, the synthesized resistance r is given by Formula (8):

$$r=r1\times r2/(r1+r2)\ [\Omega] \quad (8)$$

Voltage drop $\Delta V$ is calculated using Formulae (1) to (2) and (4) to (8) with resistivity ratio $\rho2/\rho1$ as a parameter. The results are given in FIG. 15. As shown in FIG. 15, voltage drop exceeds the allowable voltage of 10V for constant-current driving when the resistivity ratio exceeds 1/100 for a diagonal length below 50 inches. Therefore, constant-current driving is difficult to limit display apparatus size. Voltage drop may be decreased by increasing thickness of the electroconductive shadow layer 10 to decrease resistance of the layer in itself. Increasing the thickness, however, causes problems, e.g., increased material cost and process time, and warpage of the substrate in itself following that of the metallic film to interrupt the assembling works.

Therefore, in order to realize a large-size display apparatus, it is preferable that a material used in the electroconductive shadow pattern 10 has a resistivity of 1/100 or less of a material of the upper transparent electrode 8. The electroconductive shadow pattern 10 shown in FIG. 1 is supplied with power indirectly via the upper electrode 8. However, it may be supplied with power directly.

When the light-emitting element emits white color, the electroconductive shadow pattern is provided with the color filters 9a each for red, green or blue color on the pattern openings. A color conversion filter 9b, which converts the light-emitting color into red, green or blue color, is formed when the light-emitting element emits blue color. The color filter 9a or color conversion filter 9b may be provided with a region for white color in addition to red, green or blue color.

Figure 6:
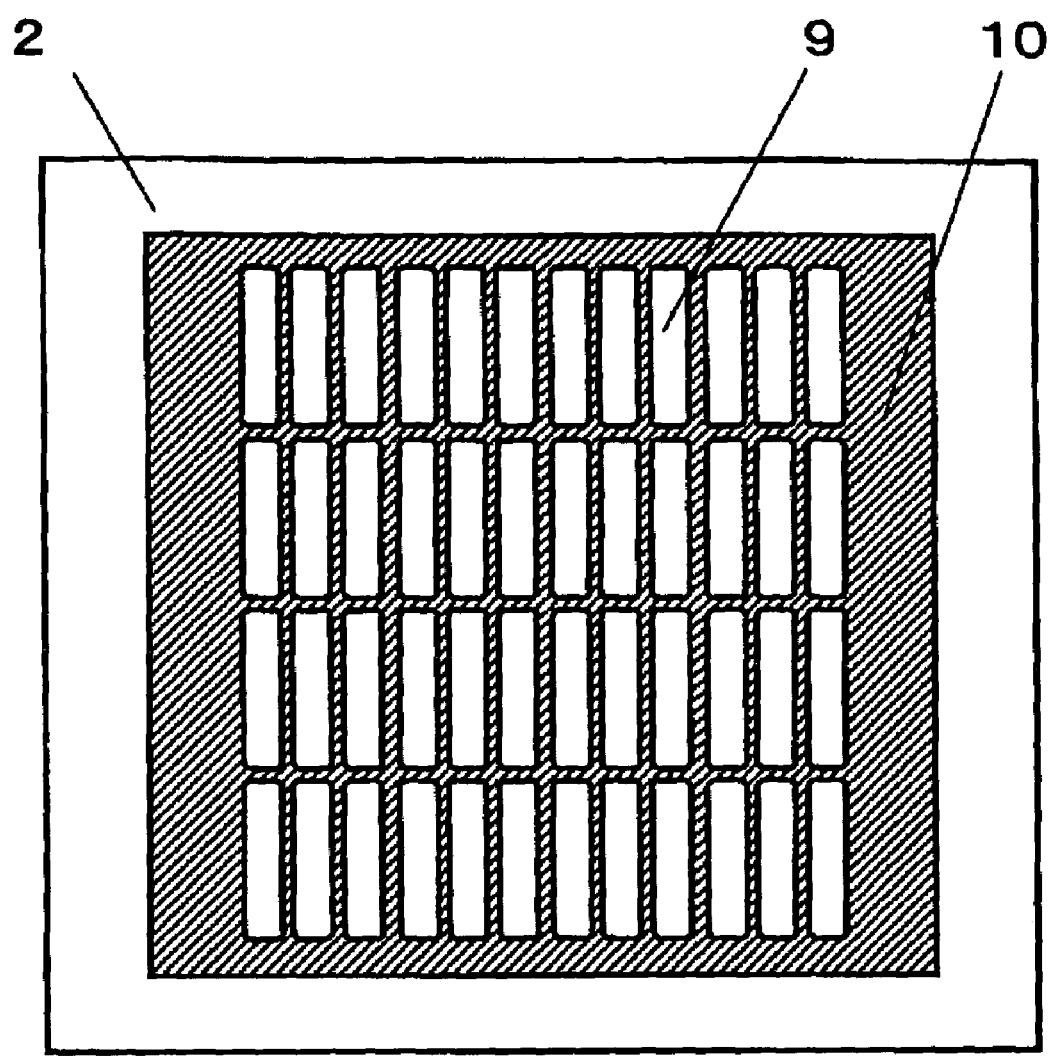
FIG. 6 is a plan view of the second substrate, illustrating the shadow pattern of the embodiments 1 and 2 of the present invention.

FIG. 6 is a plan view of the shadow pattern 10 on the second substrate 2, illustrating that the pattern 10 is formed in a net shape partly open to the pixels. The color filter 9a or color conversion filter 9b is formed on each of the openings.

An organic EL display apparatus may deteriorate while working in an atmosphere containing oxygen and moisture at a high concentration, due to emergence or growth of non-emitting points called dark spots. It is accepted that the upper concentration limit is 10 ppm for both oxygen and moisture, below which they cause no apparatus deterioration. It is therefore necessary to seal the elements with an inert gas. The apparatus is assembled in the following manner to avoid this type of problems.

An UV cure adhesive is spread in a ring on one of the first substrate 1 and second substrate 2 to form the adhesive layer 12. Then, these substrates 1 and 2 are pressed to each other with the films thereon facing each other under a vacuum in a nitrogen gas atmosphere containing oxygen and moisture each at 10 ppm or less in such a way to keep the upper electrode 8 and electroconductive shadow pattern 10 in close contact with each other. Then, the adhesive layer 12 is cured with ultraviolet ray to seal the substrates. The upper electrode 8 and electroconductive shadow pattern 10 are kept in close contact with each other, when the space between the substrates and that contained in the adhesive layer 12 are filled with nitrogen gas under a vacuum, to secure a stable electrical contact between them.

Nitrogen as an inert gas may be replaced by helium or argon gas. Use of a liquid desiccant 43 will produce a similar result.

Figure 16:
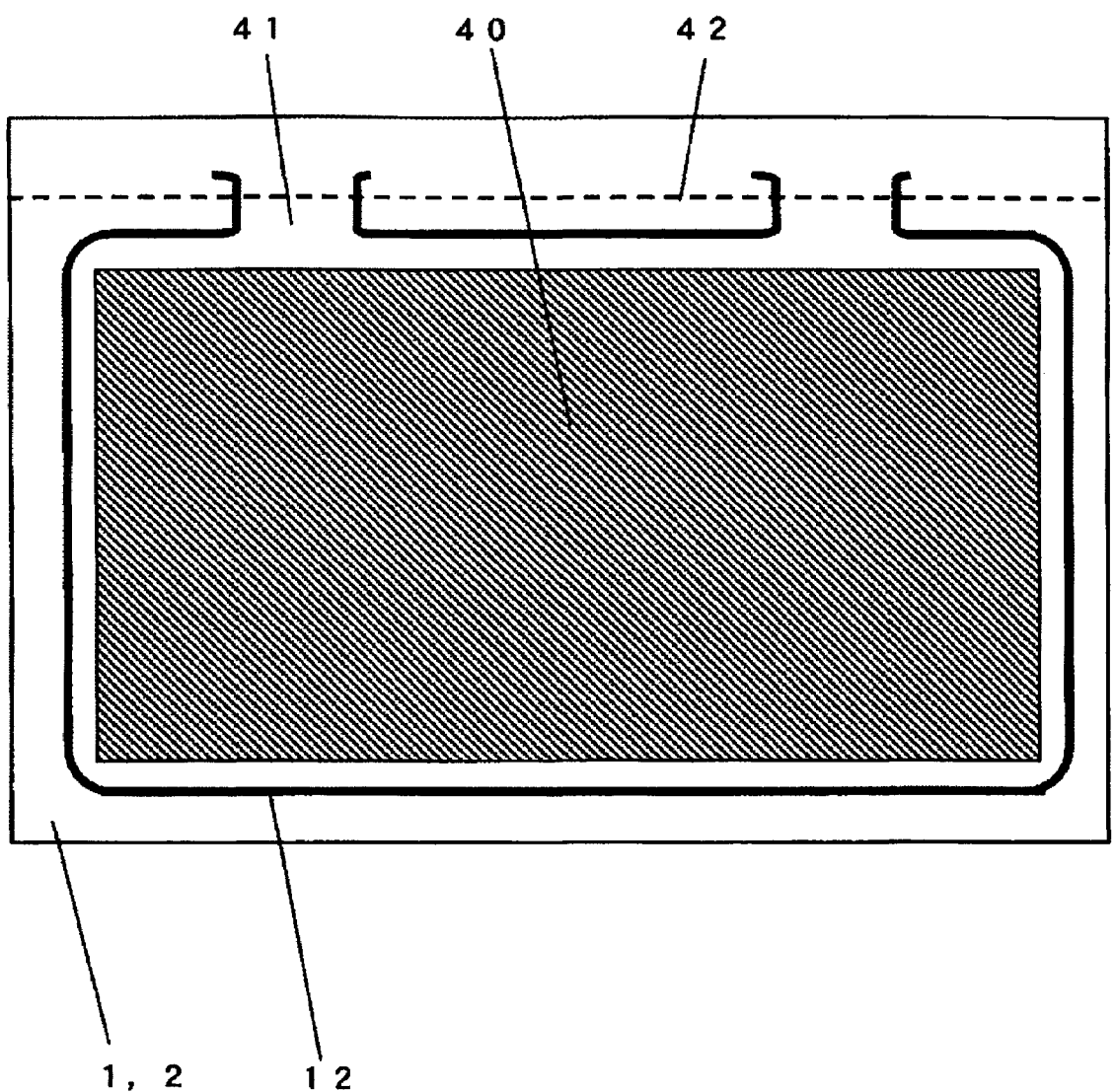
FIG. 16 presents a pattern of the adhesive layer spread to fill the display apparatus of the present invention with a liquid desiccant.

Referring to FIG. 16, when the liquid desiccant 43 is used, a pattern of the adhesive layer 12 is formed on one of the first substrate 1 and second substrate 2. The adhesive layer pattern is provided with the sealing ports 41, via which the liquid desiccant 43 is injected, and openings. The substrates 1 and 2 are placed one on another, and the adhesive layer 12 is cured with ultraviolet ray. Then, both the substrates 1 and 2 are cut off along the cutting line 42 shown in FIG. 16. Then, the space formed by the substrate 1, substrate 2 and adhesive layer 12 is evacuated under a vacuum, and the sealing ports 41 are immersed in a layer of the liquid desiccant 43 to soak up the liquid desiccant 43 therethrough by capillary action into the space. On completion of filling the space with the desiccant 43, an UV cure adhesive is spread on the sealing ports and cured with ultraviolet ray to seal the desiccant 43 in the space. Adhesion of the upper electrode 8 and electroconductive shadow pattern 10 can be enhanced by keeping the display apparatus inside under a vacuum, when it is filled with a liquid desiccant, as is the case with an inert gas.

The transistor 3 on the first substrate 1 is responsible for driving the display apparatus. The gate 26 and source 27 of the first transistor 24 are connected to outside devices via the scanning and signal lines, respectively. A voltage is applied to the drain 28 of the first transistor 24, when a voltage signal is inputted in each of the scanning and signal lines, to input a signal in the gate 30 of the second transistor 25, connected to the drain 28 of the first transistor 24. This triggers flow of current from the source 29 of the second transistor 25, connected to the current supply line, to the drain 31, to supply electrons to the organic light-emitting layer 7 via the lower electrode 5 connected to the drain 31. At the same time, holes are injected into the organic light-emitting layer 7 from the upper electrode 8 connected to the power source line at the substrate 1 edge. The electrons and holes are recombined with each other in the light-emitting layer in the organic light-emitting layer 7, to emit light from the element.

The above structure can realize, at a low production cost, a large-size display apparatus free of ununiform light brightness resulting from voltage drop at the upper electrode.

Example 1 describes an apparatus with a monochromic light-emitting layer. However, a display apparatus emitting red, green and blue colors free of ununiform light brightness, each from individual pixels, can be realized when the problems associated with metal mask fabrication precision and cost are solved.

Example 2

Figure 2:
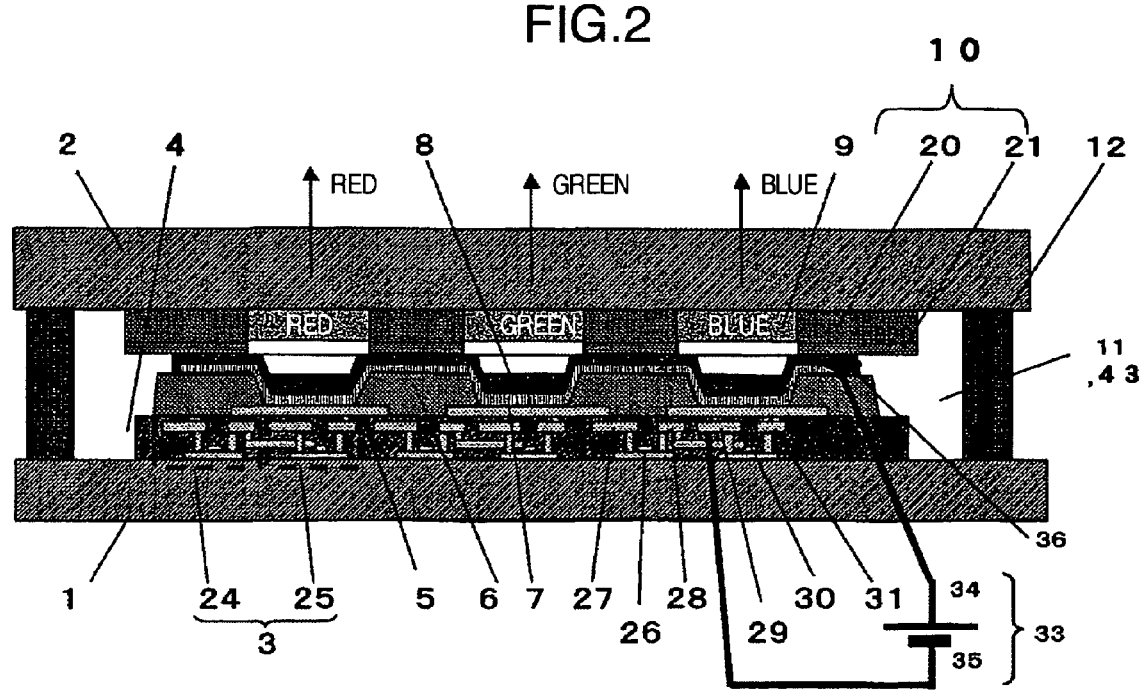
FIG. 2 is a cross-sectional view illustrating the organic EL display apparatus of the embodiment 2 of the present invention.

FIG. 2 is a cross-sectional view illustrating the organic EL display apparatus with an electroconductive shadow pattern of another embodiment. The electroconductive shadow pattern 10 may be of a 2-layer structure of the shadow layer 20 and electroconductive layer 21 of low resistance, as illustrated in FIG. 2. The electroconductive layer 20 can give a higher image contrast than the layer of metallic material alone, when incorporated with a black pigment. The electroconductive layer 20 may not be necessarily electroconductive. For example, the shadow layer 20 may be formed by a photo-litho process using a photosensitive polyimide dispersed with a black pigment, e.g., carbon. Moreover, it may be formed by printing depending on a line width of the shadow layer 20.

The electroconductive layer 21 of low resistance is made of a material similar to that used for the shadow pattern of the embodiment 1. The 300 nm thick upper transparent electrode 8 of ITO is formed on the first substrate, as is the case with the embodiment 1. It is expected that a large-size organic EL display apparatus is realized in this case, when a material having a resistivity equivalent to that of Mo or less is used to form the 300 nm thick electroconductive layer 21. Another low-resistivity material, e.g., Al, may be used in place of Mo.

Moreover, adoption of a 2-layer structure for the electroconductive shadow pattern 10 allows to adjust thickness of each of the pattern 10 and color filter layer 9 by changing thickness of the shadow layer 20. Thickness of the color filter layer 9 is set at the same level as that of the electroconductive shadow pattern (300 nm) in the embodiment 1. However, when the color filter layer 9 cannot satisfy the required optical characteristics or even cannot be produced unless it is around 1 to 3 μm thick, a total thickness of the shadow layer 20 and electroconductive layer 21 may be adjusted at a color filter layer 9 thickness or more while increasing thickness of the shadow layer 20. This facilitates electrical contact between the electroconductive shadow pattern 10 and upper transparent electrode 8.

Figure 7:
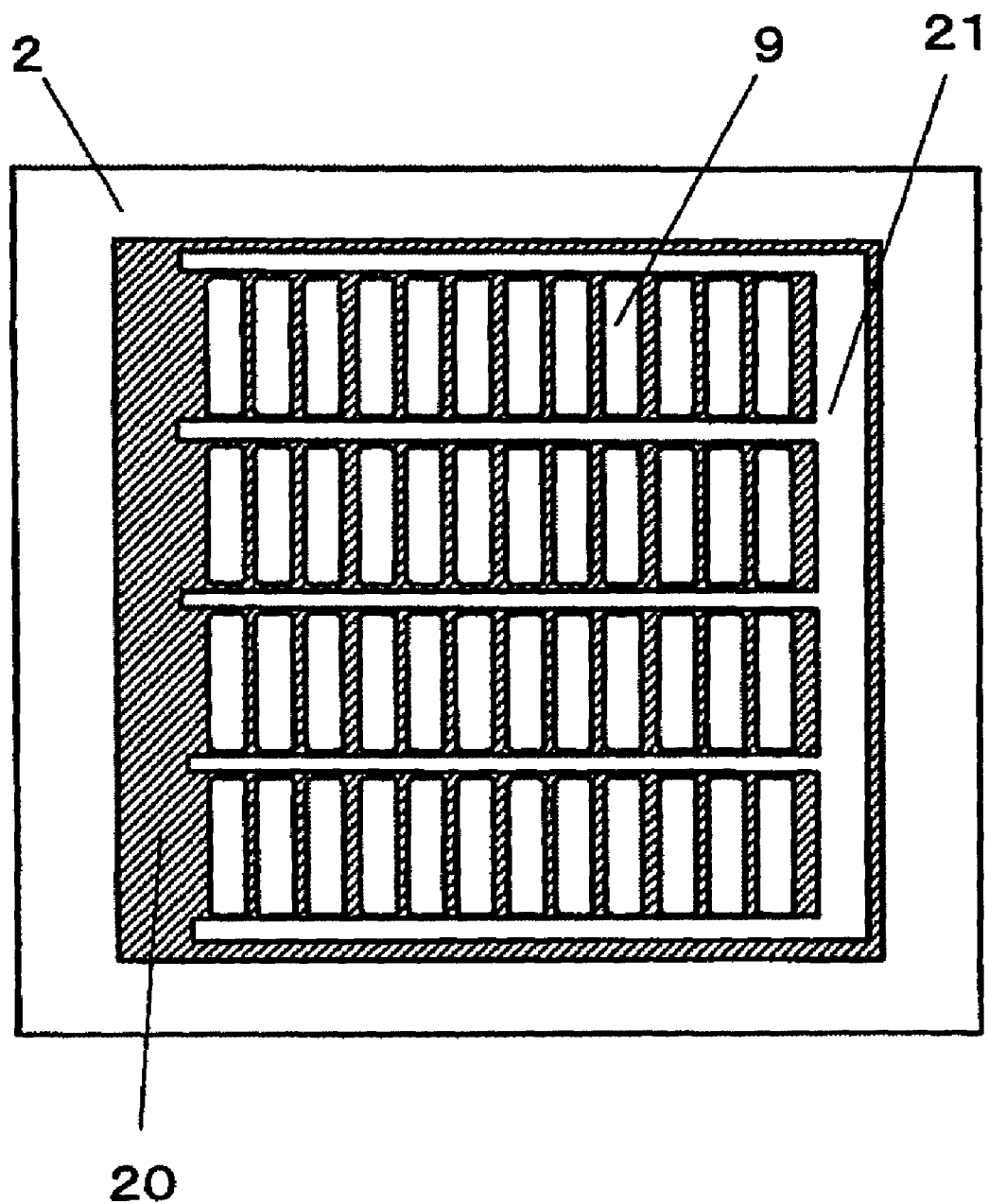
FIG. 7 is a plan view of the second substrate, illustrating the shadow pattern of the embodiment 2 of the present invention.

As is the case with the embodiment 1, the shadow layer 20 and electroconductive layer 21 are formed in a net shape on the second substrate 2, and provided with the color filter 9 on each opening, as illustrated in FIG. 6 which presents the plan view. A similar effect can be produced when the shadow layer 20 of net shape and then the electroconductive layer 21 of comb shape may be formed, as shown in FIG. 7 which presents the plan view.

Example 3

Figure 3:
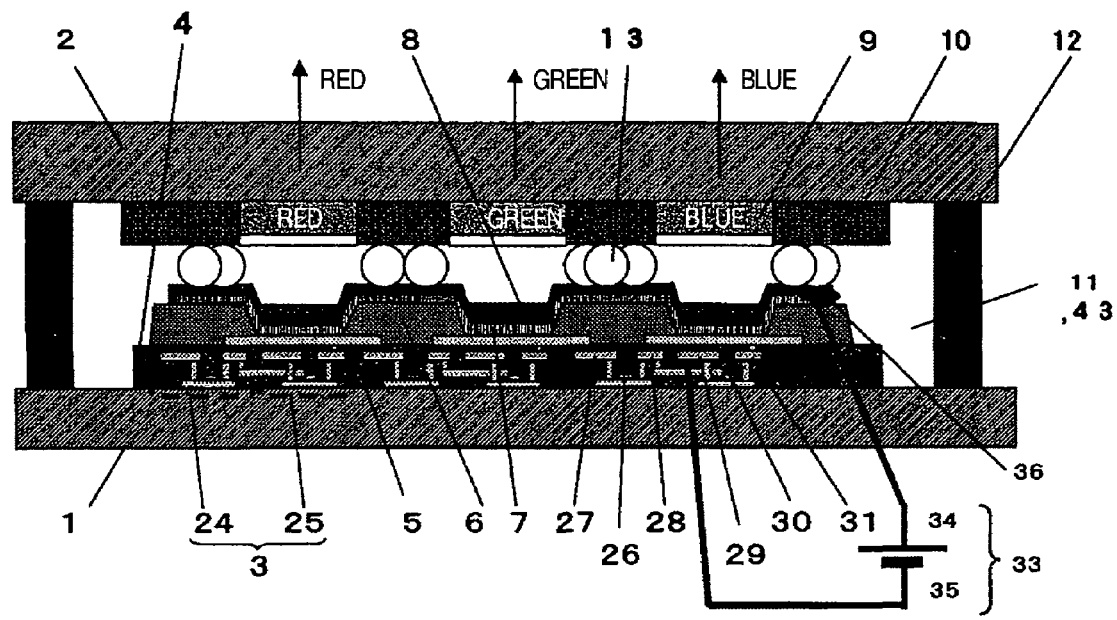
FIG. 3 is a cross-sectional view illustrating the organic EL display apparatus of the embodiment 3 of the present invention.
Figure 8:
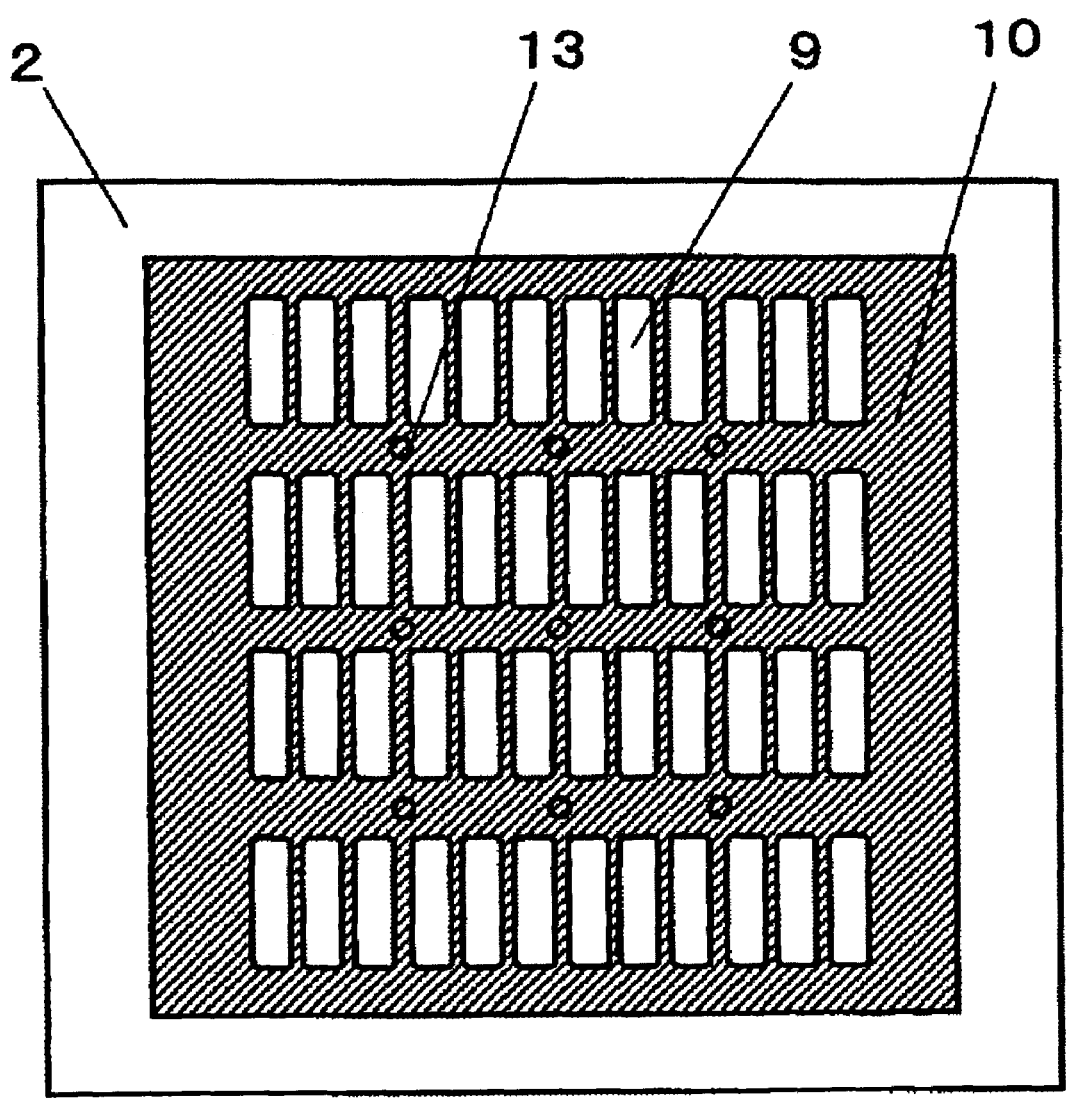
FIG. 8 is a plan view of the second substrate, illustrating the spacer of the embodiments 3 and 4 of the present invention.

FIG. 3 is a cross-sectional view illustrating the organic EL display apparatus with spherical spacers. The substrates 1 and 2 are formed by a film-making method similar to that for Example 1. An electroconductive polymer dispersed with gold-plated silica beads or metallic balls as the spherical spacer 13 is spread over the second substrate 2 by spin coating for a photo-litho process. This sets the spherical spacers 11 selectively on the electroconductive shadow pattern 10, as shown in FIG. 8 which presents the plan view. A spacer diameter of around 5 to 30 μm will be adequate. Then, the adhesive layer 12 is spread between the substrates 1 and 2 in a ring, and is cured with ultraviolet ray while these substrates are pressed to each other, to produce the organic EL display apparatus.

Example 4

Figure 4:
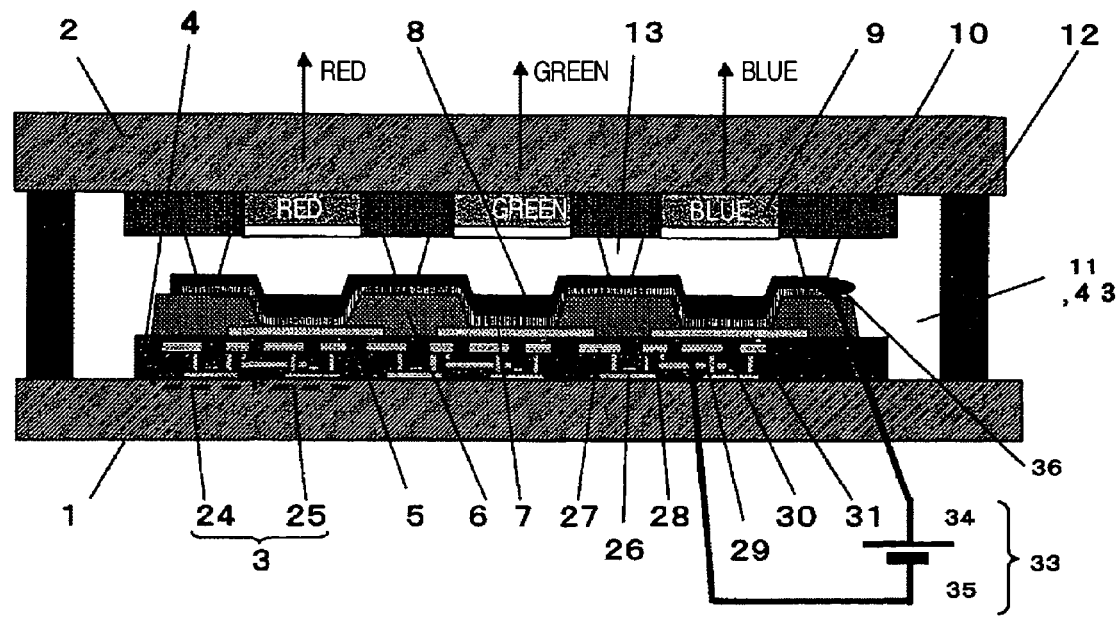
FIG. 4 is a cross-sectional view illustrating the organic EL display apparatus of the embodiment 4 of the present invention.
Figure 10:
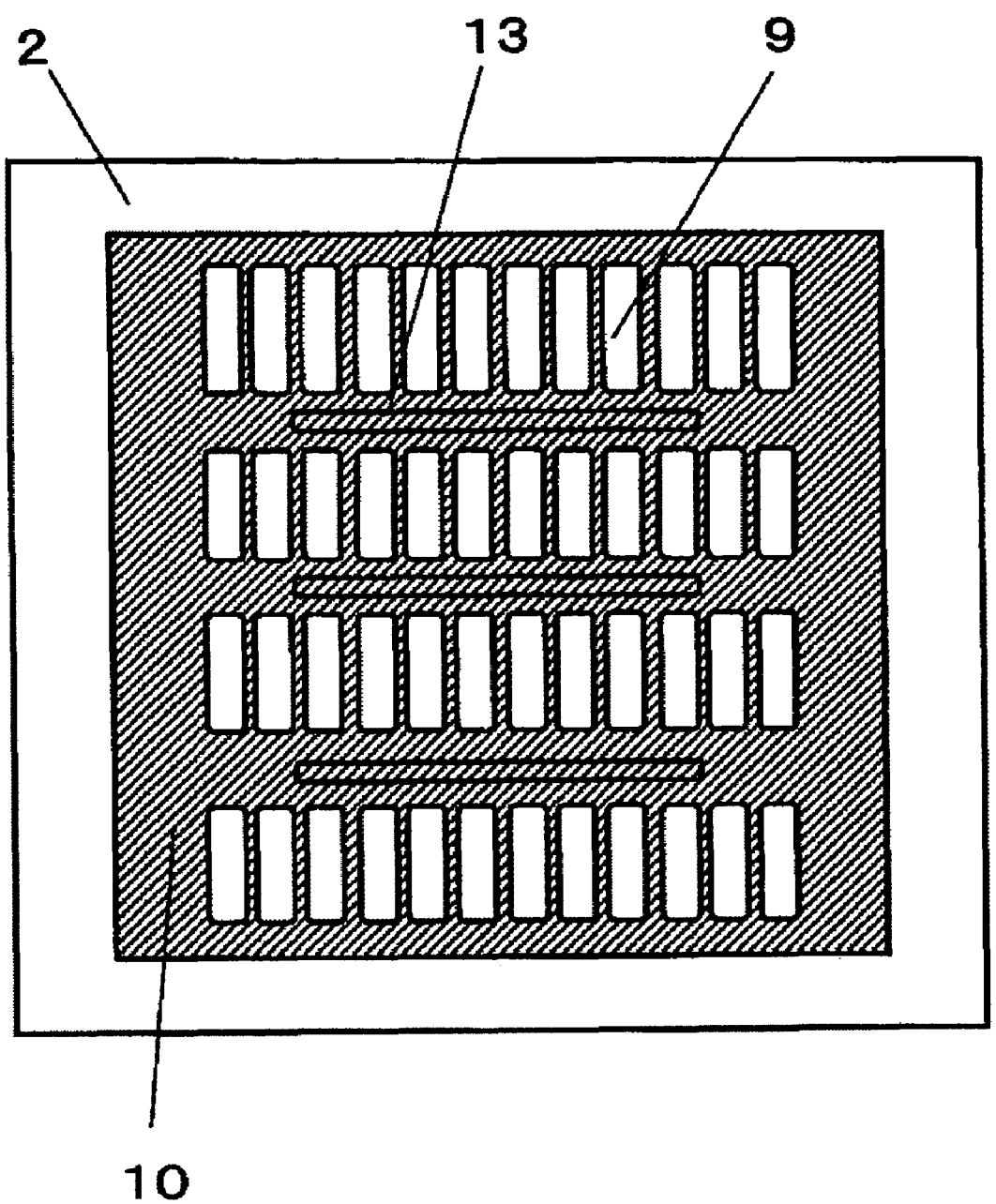
FIG. 10 is a plan view of the second substrate, illustrating the spacer of the embodiment 4 of the present invention.

FIG. 4 is a cross-sectional view illustrating the organic EL display apparatus with columnar spacers. The substrates 1 and 2 are formed by a film-making method similar to that for Example 1. The electroconductive shadow pattern 10 and then the columnar or wall-shape spacers 13 are formed on the second substrate 2, as shown in FIG. 8 or 10 which presents the plan view. These spacers 13 are made of an electroconductive material and 5 to 30 μm high. These spacers 13 may be made of a material having a resistivity on a level with that of the upper transparent electrode 8, because a height of the spacer 13 is negligible as compared with distance between the power supply point 36 and pixel. The organic EL display apparatus is produced in the same manner as in Example 2 for the other structures.

Example 5

Figure 5:
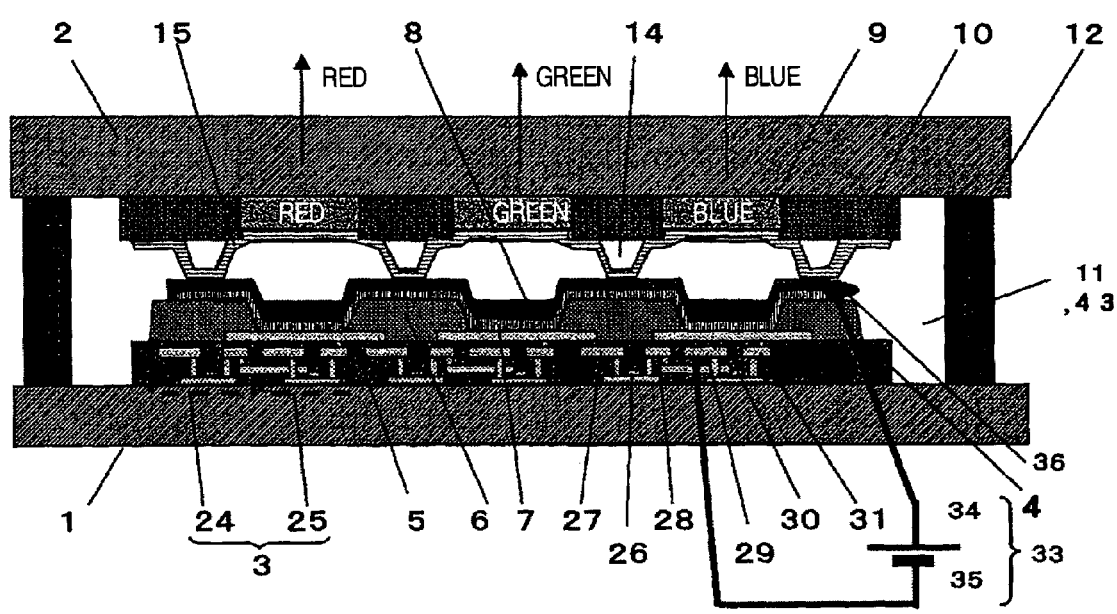
FIG. 5 is a cross-sectional view illustrating the organic EL display apparatus of the embodiment 5 of the present invention.
Figure 9:
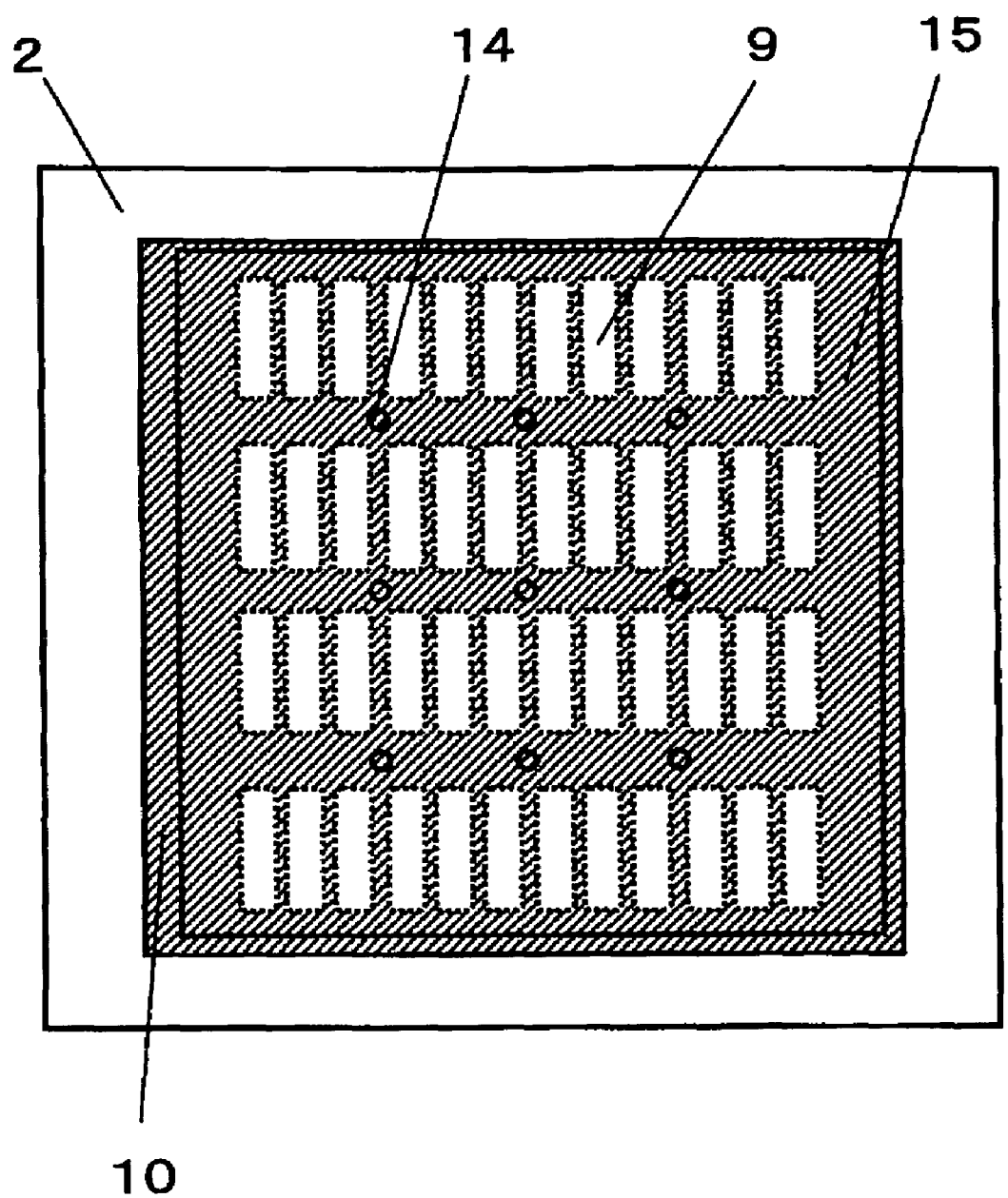
FIG. 9 is a plan view of the second substrate, illustrating the relationship among the electroconductive shadow pattern, spherical or columnar spacer and transparent, electroconductive layer of the embodiment 5 of the present invention.
Figure 11:
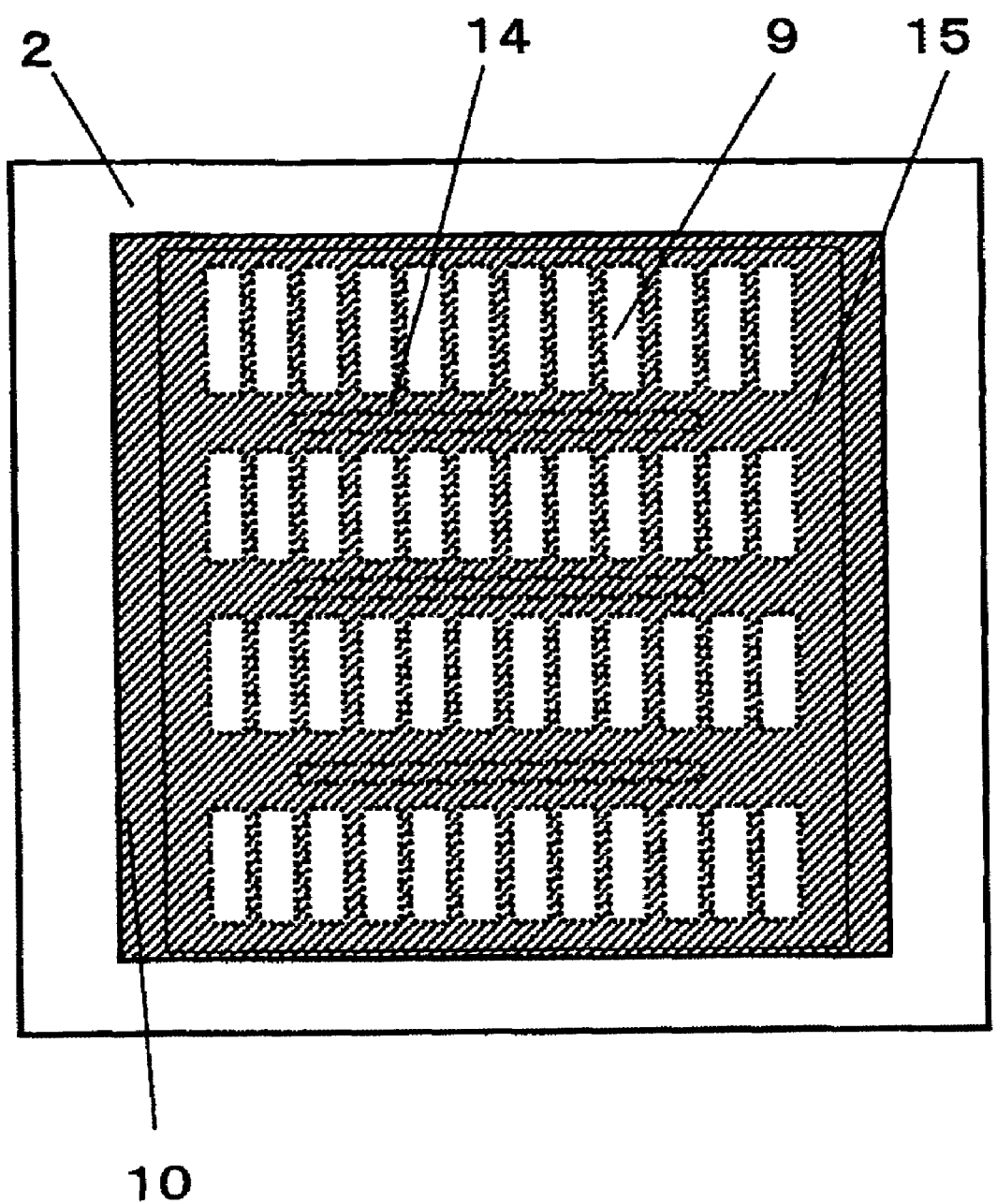
FIG. 11 is a plan view of the second substrate, illustrating the relationship among the electroconductive shadow pattern, columnar spacer and transparent, electroconductive layer of the embodiment 5 of the present invention.

FIG. 5 is a cross-sectional view illustrating the organic EL display apparatus with columnar spacers of another type. The electroconductive shadow pattern 10 and then the spacers 14 are formed in a manner similar to that for Example 4, as shown in FIG. 9 or 11 which presents the plan view. These spacers 14 are not necessarily made of an electroconductive material. The transparent electrode film 15 of ITO or IZO is formed, after the spacers 14 are set. This electrically connects the electroconductive shadow pattern 10 and upper electrode 8 on the first substrate 1 to each other via the transparent electrode 15.

Example 6

Figure 12:
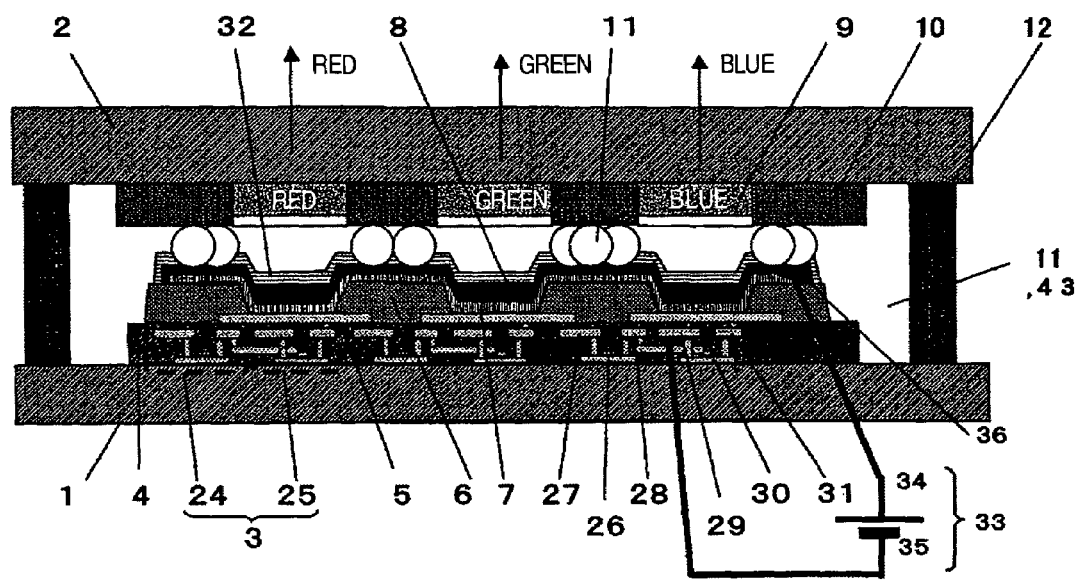
FIG. 12 is a cross-sectional view illustrating the organic EL display apparatus of the embodiment 6 of the present invention.

FIG. 12 is a cross-sectional view illustrating the organic EL display apparatus with the upper electrode 8 coated with the protective film 32 of an insulating material. As shown in FIG. 12, the protective film 32 is formed on the first substrate 1, and then the electroconductive spacers 13 are strongly pressed to the protective film 32 to bore the film while the substrates 1 and 2 are placed one on another, to connect the upper electrode 10 and electroconductive spacers 13 to each other. The protective film 32 preferably has a gas barrier capacity.

When a resin-based material is used for the protective film 32, it is practical to form the film by polymerizing the deposited monomer vapor with the aid of ultraviolet ray. The protective film may be further coated with a film of $SiO_2$, SiN or the like to improve an effect of controlling oxygen-permeability or vapor-permeability. A total film thickness of 0.5 to 2 μm is adequate.

A similar effect can be produced when the protective film 32 is open at the contact area between the electroconductive spacers 13 and upper electrode 10.

Example 7

Figure 13:
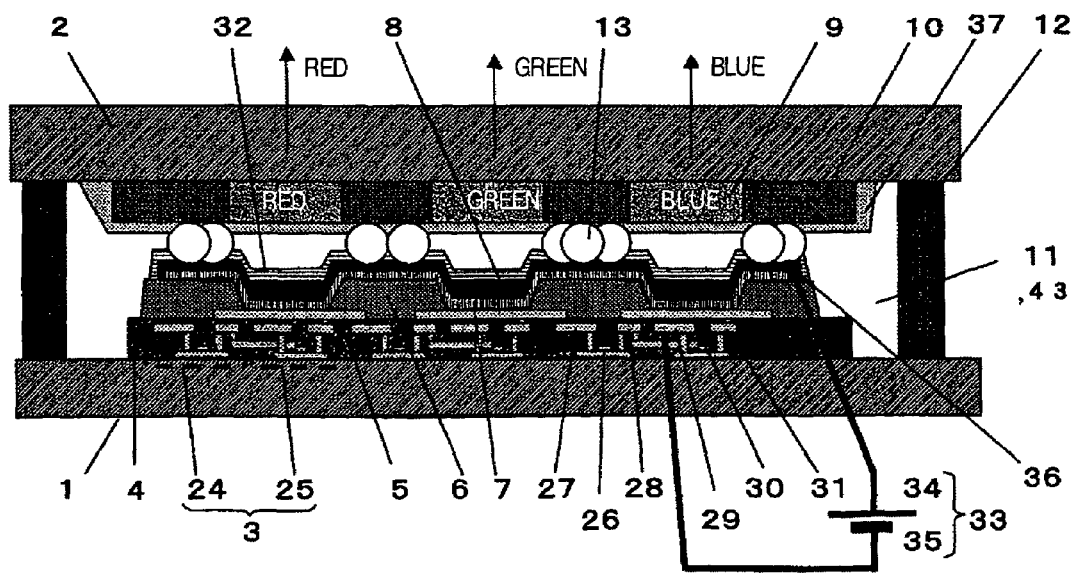
FIG. 13 is a cross-sectional view illustrating the organic EL display apparatus of the embodiment 7 of the present invention.

FIG. 13 is a cross-sectional view illustrating the organic EL display apparatus with the protective film 32 and over coat film 37 covering the upper transparent electrode 8 on the first substrate 1 and covering shadow pattern 10 and color filter 9 on the second substrate 2, respectively. As shown in FIG. 13, the protective film 32 and over coat film 37 are formed on the respective first substrate 1 and second substrate 2, and then the electroconductive spacers 13 are strongly pressed to the protective film 32 and over coat film 37 to bore these films while the substrates 1 and 2 are placed one on another, to connect the upper electrode 10 and electroconductive spacers 13 to each other.

An acrylic resin is used for the over coat film 37, and a layer thickness of 0.5 to 1 μm is adequate. A similar effect can be produced when the protective film 32 and over coat film 37 are open at the contact area between the electroconductive spacers 13 and upper electrode 10.

As described above, the present invention is useful for display apparatuses of various devices, e.g., computers, TV sets, game machines, portable image display devices, cellphones, PDAs, instruments, medical devices, automobiles, aircraft and ships.

While we have shown and described several embodiments in accordance with our invention, it should be understood that disclosed embodiments are susceptible to changes and modifications without departing from the scope of the invention. Therefore, we do not intend to be bound by the details shown and described herein but intend to cover all such changes and modifications falling within the ambit of the appended claims.

The invention claimed is:

1. An organic electroluminescence display apparatus comprising
a first substrate being coated with a transistor driving layer in which transistor elements are each provided with a gate, source, and drain interconnections, banks for separating pixels, a lower electrode for each of the pixels, an organic light-emitting layer, and an upper electrode of a transparent material; and
a second substrate being coated with an electroconductive shadow pattern, and having openings for the pixels on the first substrate and having color filters formed in the openings;
wherein the first and second substrates are sealed by an adhesive layer pro-vided around at least one of the first and second substrates that face each other in such a way that:
a sealed space between the first and second substrates is filled with an inert gas and kept under a vacuum;
the organic light-emitting layer for each of the pixels surrounded by the banks faces one of the color filters;
the upper electrode is covered with a protective film and extended over the banks to be electrically connected to the electroconductive shadow pattern via an electroconductive member; and
at least one of the upper electrode and the electroconductive shadow pattern is provided with a power supply point electrically connected to an outside DC power source; and
wherein the color filters and the electroconductive shadow pattern formed on the second substrate are further coated with a transparent overcoat film which is opposite to the protective film across the sealed space so as to electrically connect the upper electrode and the electroconductive shadow pattern to each other via the electroconductive member provided therebetween in such a way to pass through both the protective film and the transparent overcoat film.

2. The organic electroluminescence display apparatus according to claim 1, wherein the electroconductive member is a spherical spacer positioned on the electroconductive shadow pattern.

3. The organic electroluminescence display apparatus according to claim 1, wherein the electroconductive member is a columnar spacer positioned on the electroconductive shadow pattern.

4. The organic electroluminescence display apparatus according to claim 1, wherein the electroconductive member is a columnar spacer positioned on the electroconductive shadow pattern, and the electroconductive shadow pattern and upper electrode are connected to each other via a transparent electroconductive film provided on the columnar spacer.

5. The organic electroluminescence display apparatus according to claim 1, wherein the organic light-emitting layer emits a single color.

6. The organic electroluminescence display apparatus according to claim 1, wherein the organic light-emitting layer emits white color.

* * * * *